United States Patent [19]

Dard et al.

[11] 4,398,079
[45] Aug. 9, 1983

[54] MACHINE FOR WORKING METALS USING ELECTRON BEAMS

[75] Inventors: Philippe Dard, Boussy Saint Antone; Roland Cazes, Saint Maur des Fosses, both of France

[73] Assignee: Sciaky Intertechnique S.A., Vitry sur Seine, France

[21] Appl. No.: 232,159

[22] Filed: Feb. 6, 1981

[30] Foreign Application Priority Data

Mar. 31, 1980 [FR] France ................................ 80 07215

[51] Int. Cl.³ .............................................. B23K 15/00
[52] U.S. Cl. ........................ 219/121 EC; 219/121 EL; 219/121 EN
[58] Field of Search ................ 219/121 EB, 121 EM, 219/121 EC, 121 ED, 121 EF, 121 EG, 121 EL, 121 EN, 121 EP; 373/14

[56] References Cited

U.S. PATENT DOCUMENTS

| 3,020,389 | 2/1962 | Gorman | 219/121 EL X |
| 3,529,123 | 5/1970 | Hinrichs | 219/121 EC |
| 3,742,365 | 6/1973 | Sciaky | 219/121 EC |
| 4,176,271 | 11/1979 | Terai et al. | 219/121 EL X |
| 4,266,111 | 5/1981 | Trillwood | 219/121 EC X |

Primary Examiner—C. L. Albritton
Attorney, Agent, or Firm—Wolf, Greenfield & Sacks

[57] ABSTRACT

This invention concerns a machine for working metals using an electron beam, characterized in that the gun and the enclosures occupy a fixed position in relation to one another, the gun being connected to each of the enclosures through a duct provided with a sealing valve a stage for electromagnetic deflection of the beam being provided between the gun and the ducts so as to deflect the beam successively towards the enclosures through the ducts.

7 Claims, 2 Drawing Figures

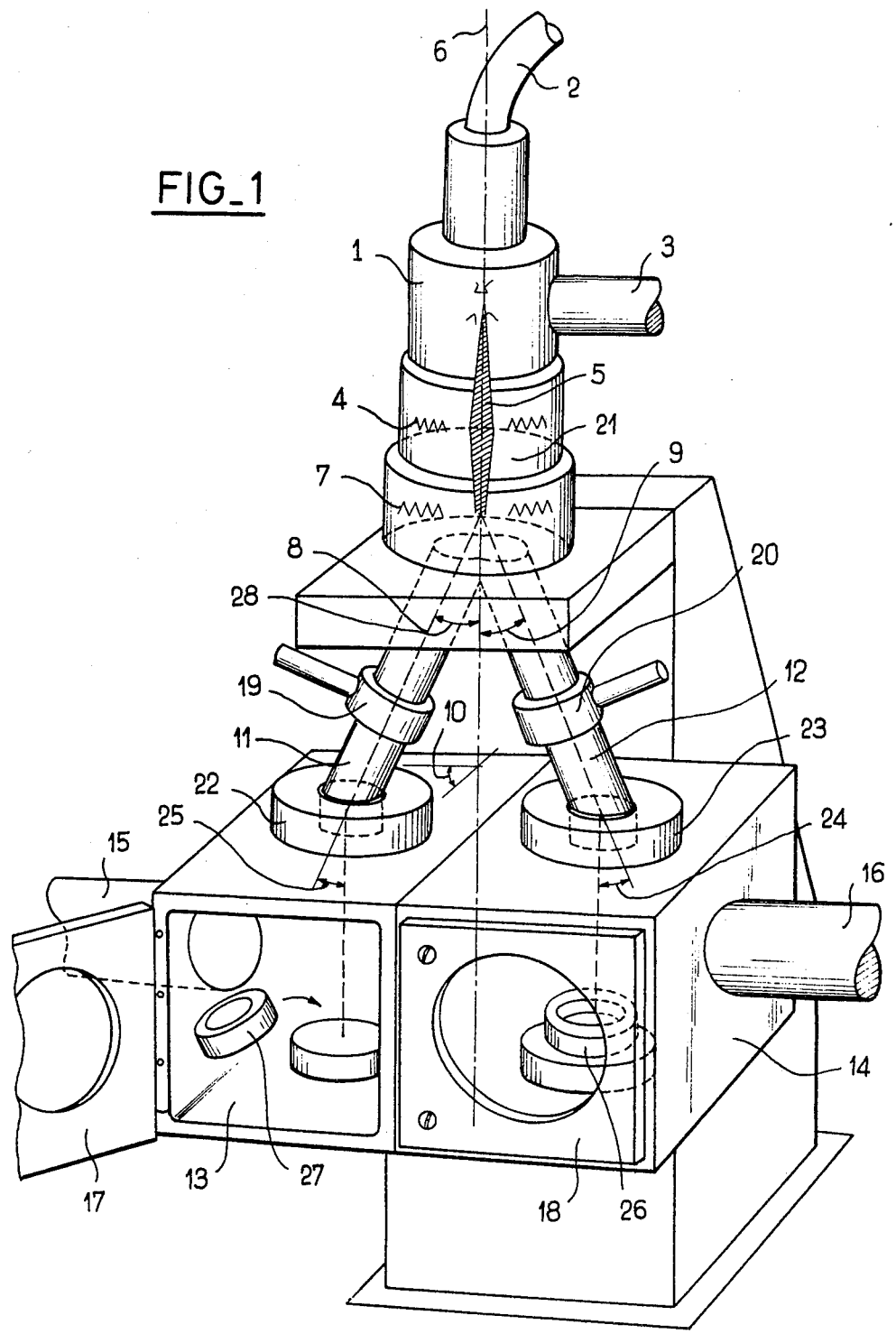
FIG_1

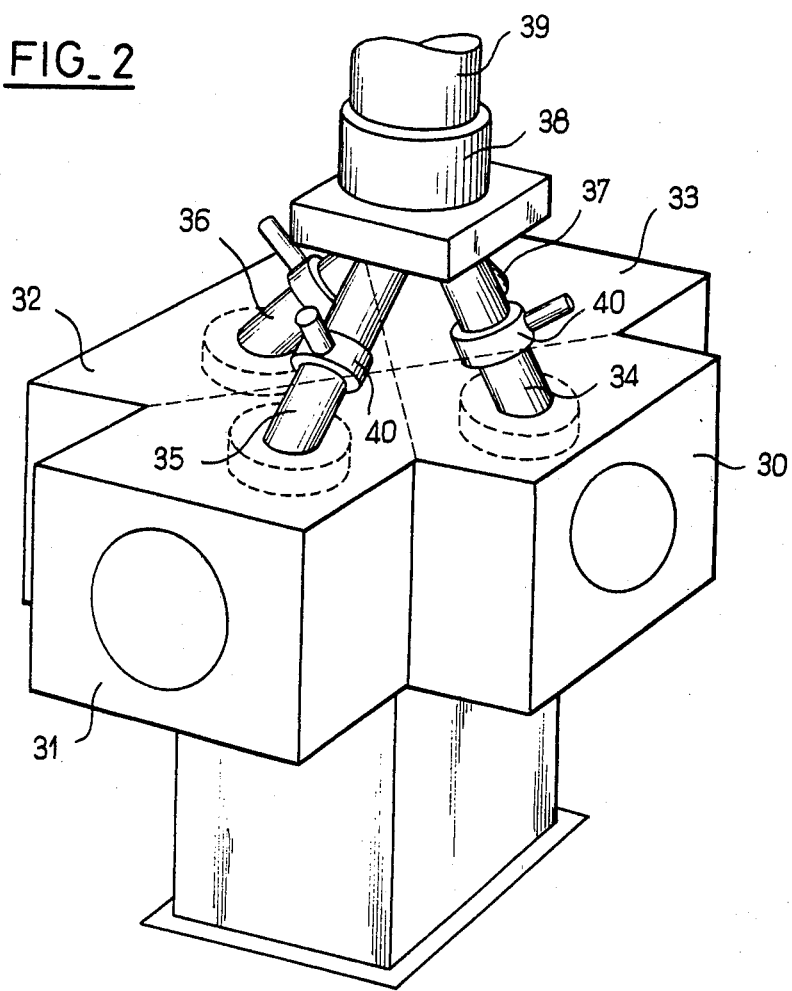

MACHINE FOR WORKING METALS USING ELECTRON BEAMS

The present invention relates to a machine for working metals using electron beams.

It is known that such a process necessitates arranging the metal workpiece, on which a machining, welding, heat-treatment or other operation is to be effected, in a hermetic enclosure in which an intermediate or high vacuum is created. This placing under vacuum which, after the operation proper, is accompanied by exposure to the ambient air, brings into action a pumping or evacuating unit whose characteristics are determined as a function of the volume of the enclosure and of the time which can be assigned to this particular stage in the operating cycle of the installation. It is known that a theoretical lower limit exists for this evacuation time, which it is not possible to reduce further.

In mass production, for which the gross metal-working time is brief, for example in the order of a few seconds, production is thus limited by the evacuation time itself and this is why the known installations are designed so that this limit is as low as possible, namely: working at relatively high vacuum levels, which may reach 30 to 40 torr, and with minimal enclosure volumes with electron gun outside the enclosure maintained separately under vacuum.

In these installations, which are provided with charging and discharging mechanisms working entirely automatically, the electron gun is operative for only a part of the total time and, therefore, in the majority of applications its duty ratio is lower than 0.50.

Installations are also known in which the electron gun has a duty ratio which is increased in relation to the previous ones, these installations being based on the use of devices with sliding joints, the purpose of which is to cover the evacuation time of an enclosure containing a new workpiece to be worked with the operating time for the workpiece being worked in an adjacent enclosure.

These devices with sliding joints are based either on the principle of a fixed gun and a revolving plate with multiple enclosures moving successively beneath the gun, or on the principle of several fixed enclosures, generally two in number, and a movable gun sliding from one to the other.

These installations have the disadvantage of requiring the utilisation of high-precision sliding mechanisms provided with joints which are subject to wear. Furthermore, the mechanical time taken by the movement added to the actual working time increases the total cycle time.

The present invention eliminates this disadvantage insofar as it does not utilise any sliding joint and any mechanical transfer mechanism for the gun, while retaining for the installation to which it is applied the property of providing a high duty ratio for the gun which remains fixed, by causing it to operate successively on several stations which are likewise fixed.

In fact, the invention essentially comprises providing a fixed gun supported by a frame, this gun being associated with a device for the electromagnetic deflection of the beam which it is thus able to emit successively and instantaneously towards a number of working enclosures. More precisely, the device comprises a first electromagnetic-deflection stage making it possible to deflect the beam by a given angle in relation to its initial axis and in one of the directions of work. The device also comprises for each of the possible paths a like number of hermetic ducts connecting the gun to the enclosures enabling the vacuum to be maintained along the path of the beam and each comprising an isolating valve. Each of the paths is provided, if necessary, with a new deflection stage so as to control in each of the directions and independently of one another the impact position in the welding zone. At this level the different ducts are hermetically connected to each of the working enclosures with which the installation is provided.

Each working enclosure, specific or not to the joints or connections to be effected, comprises its own aperture and also its own evacuating unit.

The provision of isolating valves for each product makes it possible to effect for each working station, each of which may be serviced by an operator or an automatic operating mechanism, the different operations of charging and placing under vacuum independently of one another.

The machine according to the invention thus makes it possible for a number of independent welding enclosures to be supplied by a single gun, on a shared-time basis, and has the advantage of reducing the total investment, while allowing a great diversity of simultaneous mass-production or small-scale working.

The change-over from one condition to another takes place in a practically instantaneous manner and only requires alteration of the electric currents controlling the first level of electromagnetic deflection.

Moreover, electronic controls are provided to program the beam specifically as a function of the particular working to be effected at each station: position of beam, current, voltage, focusing, vibration etc.

In the particular and very frequently occurring case of applying the machine according to the invention to the mass-production of workpieces, it would be possible for example to provide an installation with two enclosures supplied alternately by an automatic charging device, this installation being equipped with a gun provided with a deflection device and hermetic ducts, the assembly thus being in accordance with the invention.

In the case in which the working time in respect of one workpiece is equal to or greater than the total time for charging, closing the enclosure, evacuation and actuating the valve for the duct, there is achieved almost continuous utilisation of the gun and maximum production, in view of the fact that it is possible to charge the first enclosure, place it under vacuum and open its isolating valve in such a way that the connection of the gun to this first enclosure has already taken place while the working in a second enclosure is ending. When the working in this second enclosure has ended, it is thus only necessary to deflect the beam towards the waiting first enclosure, whose isolating valve is already open, in order to initiate immediately the working on the workpiece arranged in this enclosure.

The invention is illustrated non-restrictively by way of example in the accompanying drawings, in which FIG. 1 shows diagrammatically in perspective a machine according to the invention provided with two working enclosures;

FIG. 2 is a partial view in perspective of a machine with four enclosures.

The electron gun 1, supplied by a cable 2 and provided with its pumping or evacuating unit 3, comprises a focusing coil 4 and produces the beam 5 emitted along its axis of symmetry 6.

A first electromagnetic-deflection device 7 makes it possible to impart to the beam a deflection 8 indicated by an angle 9 and a direction 10, both of which are fixed, and dependent upon the position of other parts of the machine, which are described below.

Adjoining the deflection device 7, two identical ducts 11 and 12 connect in vacuum-tight manner the preceding assembly to two independent enclosures 13 and 14 provided with their own evacuating unit 15 and 16 respectively, as well as with their charging and discharging apertures 17 and 18.

The ducts 11 and 12 are each provided with a sealing valve 19 and 20 intended to isolate, during the cycle, the interior space of the gun 21 kept permanently under vacuum from each of the working enclosures, when these latter are opened for the purpose of charging and discharging.

The ducts 11 and 12 or the chambers 13, 14 are likewise each provided with a deflection device 22 and 23 respectively, making it possible to adjust independently new deflections 24 and 25 imparted to the beam when it follows the corresponding duct.

The mode of operation of the installation is simple.

The gun is firstly placed under vacuum by means of its own evacuating unit 3, the valves 19 and 20 being closed, the enclosures 13 and 14 are open and one of them is charged with a workpiece 26 to undergo treatment by the beam.

When the gun is prepared by being placed under vacuum and by energising the emitter filament, the cycle proper may commence:

closure of the charged enclosure 14 and starting up of the pump 16;

when the degree of vacuum is attained, the valve 20 opens. As a result of the two successive deflections 9 and 24 the beam, which is emitted by application of high voltage and under influence* of the control electrode of the gun, follows the duct 12 and reaches the workpiece 26 on which it carries out the desired work which, for example, may be a fusion operation.

* "deblocage"

During this time, the second working enclosure 13 is charged with another workpiece 27, then closed and placed under vacuum. When the degree of vacuum is attained, the valve 19 is opened and thus places the working station in a waiting condition, if the operation undertaken on the workpiece 26 has not ended.

As soon as the operation in the enclosure 14 has ended, the beam is interrupted or decreased, the control currents for the deflection 9 are modified accordingly so as to achieve the deflection 8, then the beam is restored. The beam then follows the path 28 and reaches the workpiece 27 where working may commence.

This change-over has only lasted a few thousandths of a second and, consequently, is negligible in relation to any mechanical displacement.

The valve 20 is then closed and subsequently the enclosure 14 is exposed to the ambient air, is opened, discharged and recharged, then after evacuation and opening of the valve 20, the enclosure 14 is as before placed in the waiting condition.

Of course, this principle may be used with installations having more than two enclosures, as illustrated in FIG. 2. In this case, the machine comprises four enclosures 30,31,32 and 33, each provided with a duct 34,35,36 and 37 respectively, said ducts leading to the deflection device 38 and to the electron gun 39. Each duct is provided with a sealing valve 40 which is opened so as to direct the beam, deflected by the deflection coils 38 and 41, successively on to the workpieces arranged in the enclosures.

We claim:

1. Machine for working metals using an electron beam, comprising an electron gun and a plurality of enclosures associated with means for creating a vacuum, these enclosures containing workpieces to be worked on to which the beam produced by the gun is directed, said machine characterised in that the gun and the enclosures occupy a fixed position in relation to one another, the gun being connected to each of the enclosures through separate ducts provided with a sealing valve, a stage for electromagnetic deflection of the beam being provided between the gun and the ducts so as to deflect the beam successively towards the enclosures through the ducts.

2. Machine according to claim 1, characterized in that each duct is provided with a beam-deflecting device at its junction with the enclosure.

3. A machine for working metals, using an electron beam and comprising;
an electron gun,
a plurality of enclosures, each having means for providing a vacuum,
said enclosures containing work pieces to be worked on to which the beam produced by the gun is directed,
said gun and enclosures occupying a fixed position in relation to one another,
separate ducts for interconnecting the gun with each of the enclosures,
and electromagnetic deflection means for providing deflection of the beam between the gun and the ducts so as to deflect the beam selectively to each duct and associated enclosure.

4. A machine according to claim 3 wherein each duct is provided with a beam deflecting device at its junction with the enclosure.

5. A machine according to claim 3 further comprising a sealing valve associated with each respective duct.

6. A machine according to claim 3 wherein said duct is fixedly connected to each of the enclosures through separate ducts.

7. A method for working means using an electron beam comprising the steps of;
providing an electron gun,
providing a plurality of enclosures,
positioning the electron gun in fixed position relative to said enclosures which are also fixed in position,
connecting said gun through ducts to each respective enclosure,
and deflecting the beam between the gun and the ducts to deflect the beam from one enclosure to another.

* * * * *